(12) United States Patent
Fribourg-Blanc et al.

(10) Patent No.: US 8,192,672 B2
(45) Date of Patent: Jun. 5, 2012

(54) METHOD FOR PRODUCING A RETENTION MATRIX COMPRISING A FUNCTIONAL LIQUID

(75) Inventors: Eric Fribourg-Blanc, Grenoble (FR); Stéphanie Le Calvez, Sassenage (FR); Bruno Mourey, Coublevie (FR)

(73) Assignee: Commissariat a l'Energie Atomique, Paris (FR)

( * ) Notice: Subject to any disclaimer, the term of this patent is extended or adjusted under 35 U.S.C. 154(b) by 52 days.

(21) Appl. No.: 12/622,399

(22) Filed: Nov. 19, 2009

(65) Prior Publication Data
US 2010/0133727 A1 Jun. 3, 2010

(30) Foreign Application Priority Data
Nov. 27, 2008 (FR) ...................... 08 58058

(51) Int. Cl.
*B29C 67/20* (2006.01)
*H01L 51/54* (2006.01)
*H01L 51/56* (2006.01)
*G02F 1/1337* (2006.01)

(52) U.S. Cl. ...... 264/413; 264/112; 264/45.1; 264/1.38; 264/494; 65/17.3

(58) Field of Classification Search .................. 264/112, 264/41, 45.1, 1.7, 1.36, 1.38, 494, 413; 65/17.3
See application file for complete search history.

(56) References Cited

U.S. PATENT DOCUMENTS

| | | | | |
|---|---|---|---|---|
| 3,978,580 A | * | 9/1976 | Leupp et al. | 29/886 |
| 5,571,463 A | * | 11/1996 | Sypula et al. | 264/45.9 |
| 6,183,855 B1 | * | 2/2001 | Buckley | 428/317.9 |
| 7,897,962 B2 | * | 3/2011 | Tanaka et al. | 257/40 |
| 2002/0164474 A1 | * | 11/2002 | Buckley | 428/308.4 |
| 2004/0029303 A1 | | 2/2004 | Hart et al. | |
| 2005/0195470 A1 | * | 9/2005 | Takeda | 359/296 |
| 2006/0110919 A1 | * | 5/2006 | Moriya et al. | 438/675 |
| 2007/0173166 A1 | * | 7/2007 | Ding et al. | 445/25 |
| 2008/0116579 A1 | * | 5/2008 | Araumi | 257/759 |
| 2008/0123045 A1 | * | 5/2008 | Jeng et al. | 349/189 |
| 2009/0246546 A1 | | 10/2009 | Keppner et al. | |
| 2010/0014036 A1 | | 1/2010 | Caplet | |

(Continued)

FOREIGN PATENT DOCUMENTS
EP 1 791 197 5/2007
(Continued)

OTHER PUBLICATIONS

Cheylan et al., "Optical Study of Polymer Infiltration into Porous Si Based Structures," Proc. of SPIE, vol. 6593, pp. 65931K-1-65931K-11 (May 2007).

(Continued)

*Primary Examiner* — Joseph Del Sole
*Assistant Examiner* — Nahida Sultana
(74) *Attorney, Agent, or Firm* — Nixon Peabody LLP (57) ABSTRACT

A method for fabricating a device provided with one or more cavities filled with at least one liquid, comprising the steps of: (a) forming one or more microcavities on a support separated from each other by one or more walls, and filled with at least one given porous material; (b) filling, in at least one cavity filled with said porous material, by means of at least one given functional liquid; and (c) forming a sealing layer enabling said cavities to be sealed.

9 Claims, 5 Drawing Sheets

U.S. PATENT DOCUMENTS

2010/0133727 A1* 6/2010 Fribourg-Blanc et al. .... 264/413
2010/0171101 A1* 7/2010 Tanaka et al. ................... 257/40

FOREIGN PATENT DOCUMENTS

| FR | 2 872 589 | 1/2006 |
| WO | 99/45143 | 9/1999 |
| WO | WO 2007/114244 | * 10/2007 |

OTHER PUBLICATIONS

European Search Report for European Patent Application No. EP09176781 (Dec. 14, 2009).

Kuo et al., "Monolithic Integration of Well-Ordered Nanoporous Structures in the Microfluidic Channels for Bioseparation," Journal of Chromatography A, vol. 1162, No. 2, pp. 175-179 (Aug. 2007).

Nishijima et al., "Inverse Silica Opal Photonic Crystals for Optical Sensing Applications," Optics Express, vol. 15, No. 20, pp. 12979-12988 (Oct. 2007).

NUNC, "Tapes, Lids and Mats," Announcement NUNC INTERNATIONAL, pp. 1-4 (Jan. 2006).

Preliminary Search Report for French Application No. FR0858058 (Aug. 20, 2009).

Trejo-Valdez et al., "Aerosol-Gel Deposition of Photocurable ORMOSIL Films Doped with a Terbium Complex," Optical Materials vol. 25, pp. 179-184 (2004).

Yang et al., "Opal Circuits of Light-Planarized Microphotonic Crystal Chips," Advanced Functional Materials, vol. 12, No. 6,7, pp. 425-431 (2002).

* cited by examiner

METHOD FOR PRODUCING A RETENTION MATRIX COMPRISING A FUNCTIONAL LIQUID

CROSS REFERENCE TO RELATED APPLICATIONS OR PRIORITY CLAIM

This application claims priority of French Patent Application No. 08 58058, filed Nov. 27, 2008.

DESCRIPTION

1. Technical Field

The invention relates to the production of a device comprising at least one functional liquid, in particular a device with microcavities filled with functional liquid.

It may be applied in particular to the field of optics for the production of determined or spatially variable refractive index transmission surface.

The invention also relates to an improved method for filling one or more microcavities by means of a liquid, and producing a device comprising one or more sealed microcavities filled with a functional liquid.

2. State of the Prior Art

For certain applications, particularly optical, it may be desired to confine a functional liquid at the surface of a substrate in order to limit the spreading or/and the evaporation of said liquid.

"Functional liquid" is taken to mean a liquid formed of one or more substances chosen for their specific properties, depending on their application, for example optical, absorption or refractive index properties in the case of optical applications, or for example electrical properties, in particular electrical conduction, when for example the functional liquid forms an electrolyte in the case for example of capacitors, or liquid electrolyte photovoltaic cells.

Conventionally, to limit the spreading of a liquid on a substrate, a surface treatment of said substrate may be carried out, in order to modify the wettability of the liquid on the surface of the substrate. In the case where several different functional liquids are dispensed, any modification of the wettability of the substrate for each of the liquids could prove to be difficult, in so far as it may necessitate an appropriate surface treatment for each of the liquids and even applying different localized surface treatments.

Another means for preventing the evaporation of a liquid on a substrate is to ensure at least a saturating vapor pressure of said liquid above the substrate, which in general poses a problem.

The problem is posed of finding a novel method for producing a device comprising at least one functional liquid and which does not include the above mentioned drawbacks.

DESCRIPTION OF THE INVENTION

The present invention relates to a method for producing a device provided with one or more cavities filled with at least one liquid trapped in a porous retention material, comprising the steps of:

a) forming a porous material in one or more cavities formed in at least one layer deposited on a support, one or more walls produced in said layer separating between them the cavities, b) filling at least one of said cavities by means of at least one liquid known as "functional liquid".

The cavities may be microcavities. "Micro-cavities" is taken to mean cavities in which the dimension, in other words the smallest dimension of the cavities other than their depth, may be between 1 µm and several hundreds of µm, and for example between 10 and 500 µm.

The porous material is provided to form a retention means or a retention matrix of said given liquid.

Localized retention zones may thereby be obtained.

According to a first implementation possibility of the porous material, said porous material and said walls of cavities may be formed from a same layer.

It is firstly possible to produce the walls, then, in zones of this same layer separate from the walls, to form porosities.

To do this, the method may comprise at step a) steps of:

depositing a layer of at least one given material, such as a sol-gel material, the given material being suited to being transformed into gel and being photosensitive, exposure to a light radiation of first parts of the layer of said given material, whereas second parts of the layer of said given material are protected from said radiation, the first parts or the second parts being intended to form said walls of said cavities, forming porosities in certain parts of the layer.

According to a second implementation possibility of the porous material, after producing said cavities, the formation of said porous material at step a) may comprise steps of:

depositing in at least one of said cavities a given liquid comprising particles such as beads, in suspension, eliminating said given liquid, so as to form a cluster of particles, in particular a cluster of beads.

The cluster of beads may thereby form a porous material.

According to an alternative, the production of the porous material may comprise additional steps after producing said cluster of beads, in particular steps:

of infiltration of the cluster of beads by a liquid intended to be solidified, of solidification of said liquid, of elimination of said particles.

According to a third implementation possibility of the porous material, after formation of said cavities, the formation of the porous material at step a) may comprise steps of:

depositing in at least one of said cavities a mixture, of at least one given liquid material capable of being transformed into gel, and at least one solvent, treating said mixture so as to transform said given material into gel, elimination of said solvent.

The porous material may be an aerogel or be formed by means of a porogen material.

The method may further comprise: a step c) of forming at least one layer, or membrane, for sealing said cavities. Said membrane makes it possible, with the porous material, to avoid the evaporation of the liquid from the cavities.

According to one possibility, particularly when the given liquid does not completely fill the volume of the cavity or cavities, the membrane or sealing layer may be formed of a material infiltrated into the porous material and solidified, for example a polymer material infiltrated into the porous material and solidified. This makes it possible to ensure a good mechanical resistance of the sealing.

When the given liquid completely fills the volume of the porous material present in the cavity, the membrane or sealing layer may be based on a material, for example polymer, covering the infiltrated liquid and retained in the porous material.

The membrane or sealing layer may be formed by delivering onto the porous retention material containing the given liquid, another polymerizable liquid, then by polymerizing said other liquid.

According to one possible implementation, the layer for sealing the cavities, produced at step c), may be based on an adhesive, for example transparent to a radiation in the visible domain for an optical application.

The sealing layer may be produced at a pressure between 1 and 500 mbars, or under primary vacuum. The retention matrix, or the retention material, then makes it possible to prevent any evaporation of the functional liquid while producing the sealing layer.

For an optical application, the liquid for filling the cavities may be chosen for example among one of the following liquids: mineral oil, or printing ink oil, silicone oil, thermoreversible gel based on a liquid and a gelling agent such as N-benzyloxycarbonyl-L-alanine-4-hexadecanoyl-2 nitrophenyl ester with cyclohexane.

According to one possible implementation, several separate cavities may be formed, step b) then comprising the filling of several of said cavities by means of said given liquid, the sealing layer formed at step c) and the cavities forming several separate sealed enclosures filled with said given liquid.

According to an alternative, step b) may comprise a dispense of said given liquid in at least one of said cavities, and a dispense of at least one other liquid in one or more other cavities.

The invention also relates to a device obtained by means of a method as defined previously.

The invention thus relates to the production of a device comprising at least one liquid called "functional liquid" contained in at least one porous retention material, wherein the porous material and the liquid may be situated in one or more microcavities, in particular cavities or microcavities sealed by at least one sealing layer.

BRIEF DESCRIPTION OF DRAWINGS

Other characteristics and advantages of the invention will become clearer on reading the following description and by referring to the appended drawings, given uniquely by way of illustration and in no way limiting.

Identical, similar or equivalent parts of the different figures bear the same numerical references so as to make it easier to go from one figure to the next.

In order to make the figures easier to read, the different parts represented in the figures are not necessarily to the same scale.

DETAILED DESCRIPTION OF SPECIFIC EMBODIMENTS

An example of method according to the invention for producing a device comprising one or more cavities, in particular microcavities filled with at least one liquid, will now be given with reference to FIGS. 1A-1D.

Figure 1A:
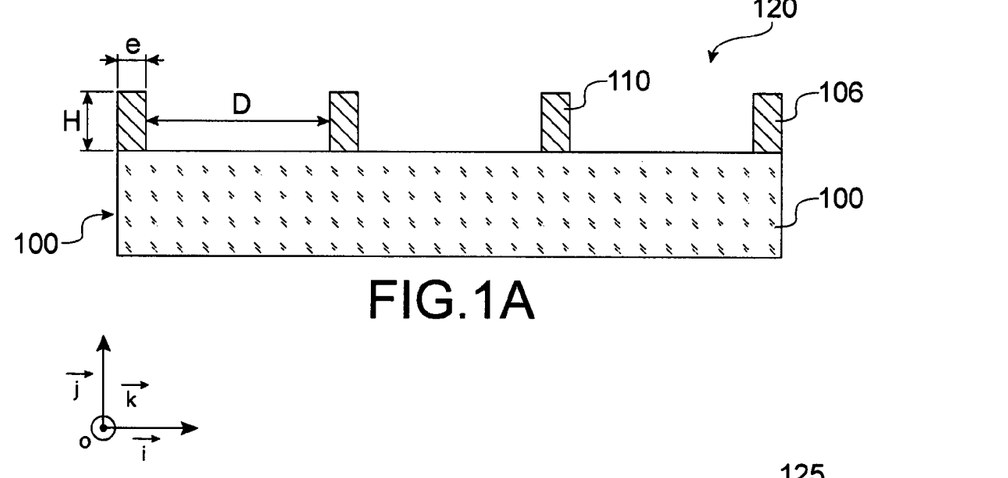
FIGS. 1A to 1D illustrate an example of method according to the invention for producing a device comprising microcavities filled with at least one functional liquid trapped in a retention matrix.

On a support 100, firstly one or more cavities 120 or vessels 120 or enclosures 120 are formed, each cavity 120 being delimited laterally by walls 110 formed in one or more thin films, as well as at the bottom, by a layer of the support.

The walls 110 of the cavities 120 may be distributed so as to confer to said cavities a shape that, in the plane of the substrate, may be, according to several examples: circular, oval, square, rectangular, polygonal, or star-shaped. A tessellation of the plane may be carried out. Such a tessellation may be organized according to a regular geometry, for example, triangular, rectangular, or hexagonal. It is also possible to implement a tessellation by means of two patterns for example with an octagon and a square. Any combination of shapes enabling a tessellation of the plane may be employed. The choice of tessellation is adapted as a function of the anticipated application for the device. The walls 110 separating the cavities 120 ensure their mutual leak tightness.

The support 100 may be transparent, and for example in the form of a quartz glass tile or a layer of flexible material such as polyethylene terephthalate (PET).

According to one implementation possibility of the cavities 120, said cavities may be produced by deposition of a layer 106, on the support 100, then by etching of said layer 106 so as to delimit the sites of the walls 110 of the cavities 120. The layer 106 in which the cavities 120 are defined may be, for example, a layer of photosensitive resin. The production of the cavities may thus comprise at least one photolithography step.

According to an alternative, the cavities 120 may be formed by means of a method wherein a layer 106 is formed on the support, then the sites of the cavities 120 are produced by stamping, by means of a mold provided with protruding patterns that is applied by pressing onto the layer 106.

According to another alternative, a layer 106, for example based on polymer material, may be deposited on the support 100 then said layer 106 is locally etched through a mask, for example by RIE, plasma etching or high density etching with, for example, a mixture of $O_2$, a $SF_6$ and/or $CHF_3$ type fluorinated gas.

According to another alternative, the layer 106 may be formed by laminating on a substrate 100 a layer, for example based on polymer material in which the cavities 120 have been formed beforehand, for example by etching.

The size, the location of the cavities 120 depend on the anticipated application for the device.

For an optical application, the walls 110 may be formed according to a geometry and a material provided so as not to introduce perturbations, or introduce negligible or non visible perturbations, on the path of light rays passing through the support 100. The walls 110 may if necessary be formed of a material, transparent to the radiations of the visible domain and having a homogenous refractive index. The walls 110 of the cavities may for example be produced by means of a layer 106 of ORMOCER® based resin. The refractive index of this resin may be adapted and modulated particularly as a function of the proportion of ORMOCER®.

The walls 110 separating the cavities 120 may have a thickness e defined in a direction parallel to the principal plane of the substrate or support (defined in FIG. 1A by a plane parallel to the plane $[O; \vec{i}; \vec{k}]$ of an orthogonal mark $[O; \vec{i}; \vec{j}; \vec{k}]$ defined in FIG. 1A) for example between 0.1 µm and 5 µm, or between 1 µm and 3 µm.

The walls 110 may also have a height H (H being defined in FIG. 1A in a direction parallel to the vector $\vec{j}$ of the orthogonal mark [O; $\vec{i}$; $\vec{j}$; $\vec{k}$]) for example between 5 μm and 50 μm or for example between 5 μm and 50 μm, or between 10 μm and 30 μm.

The cavities 120 may also have a diameter or a side or a critical dimension D (defined in FIG. 1A in a direction parallel to the plane [O; $\vec{i}$; $\vec{k}$] of the orthogonal mark [; $\vec{i}$; $\vec{j}$; $\vec{k}$]) for example between 20 μm and 500 μm or for example between 100 μm and 300 μm.

In one case where the dimension of the cavities 120 is low and for example between 10 and 500 μm, these cavities are called "microcavities".

Then (FIG. 1B), a porous material is formed in the cavities 120, or the cavities 120 are filled by means of at least one porous material 125. The porous material 125 is provided to play the role of retention material and is also known as liquid (s) retention matrix.

Figure 1B:
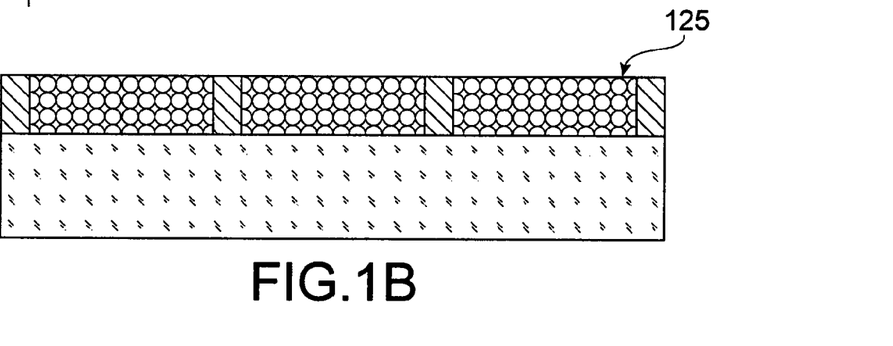

The porous material 125 may be such that it has a high pore density, for example so that the density of material forming the solid skeleton is less than 10 mg/ml.

The porosity level of the porous material is adjusted as a function of the targeted application.

For an optical application, a control of the density of the porous material may be implemented, in order to obtain a low amount of material forming the skeleton.

In the case of an application to an optical device, the porous material 125 may be chosen so as to have an optical index and in particular a refractive index similar to that of the liquid or liquids also intended to fill the cavities 120.

The porous material 125 is preferably a material with open porosity wherein the majority of pores communicate with each other and towards the exterior of the material. The tolerance threshold of non-communicating porosities depends on the targeted application. The porosity of the material 125 may be provided as a function of the requisite refractive index.

According to one possibility, the porous material 125 may be an aerogel, such as for example a silica aerogel. Throughout the present description, "aerogel" is taken to mean a porous material obtained from extraction of the liquid of a gel. The porous material 125 may be formed for example by means of a sol-gel method, wherein the basic sol-gel material may be delivered or deposited in the cavities 120 by an ink jet type apparatus. After formation of the gel, a step of extraction by lyophilization or supercritical extraction may then be carried out in order to obtain an aerogel.

According to other possibilities, the sol-gel material from which the porous material 125 is formed may be deposited by spin coating or dipping or by spray coating or coating of the type usually called "meniscus coating".

According to one example, the porous material 125 may be a silica sol-gel aerogel or a hybrid organic-inorganic sol-gel material for example a ORMOSIL type $SiO_2$—$TiO_2$ material as described in the document "Aerosol-gel deposition of photocurable ORMOSIL films doped with Terbium complex", of M. Langlet & al., Optical Materials, 25, (2004) 179-184.

In the case where the porous material 125 is an aerogel, said aerogel may be formed of a cured ultra-porous structure, the specific surface of which may be for example at least 500 $m^2$/g and in which the solid volume of the material may attain, for example, between 0.1% and 10% of the volume of a cavity 120. The solid volume of the porous material may attain for example at the most 10% of the volume of a cavity 120 so as to leave around 90% of the volume of the cavity available with a view to a filling by a liquid.

According to another example, the porous material 125 may be a porous polymer material, for example a porous polymer formed by the radical polymerization of trimethylolpropane trimethacrylate by means of at least one associated porogen material such as for example acetone, chlorohexanone, or toluene.

The porous material may comprise pores or porosities of diameter that may be between several nanometers and ten or so micrometers.

After having formed the porous material 125 in the microcavities, the volume of the solid skeleton of this material may be reduced, and the size of the pores increased.

For example, when the porous material 125 is an aerogel, to increase the size of the pores, a controlled dissolution of the aerogel material may for example be carried out, or for example in the case of a silica based porous material, hydrofluoric acid may be used to increase the size of the pores and to facilitate on the one hand the penetration of the liquid and, on the other hand, to reduce the optical diffusion effects. This may in particular be carried out by a gas phase hydrofluoric acid treatment method. The dilution of the acid in the gas phase makes it possible to regulate the dissolution kinetic of the porous material and thus the remaining fraction.

For an optical application of the device, the porous material 125 is chosen preferably so that the average thickness of the walls of the pores is less than the range of wavelengths of the radiation used. For example, for a visible radiation, this thickness is less than 200 nm.

Several detailed embodiments of the porous material 125 will now be given.

A first detailed example of method for forming the porous retention material 125 is given with reference to FIGS. 4A-4D.

To produce said material, a technique of the infiltrated opal type is carried out.

Figure 4A:
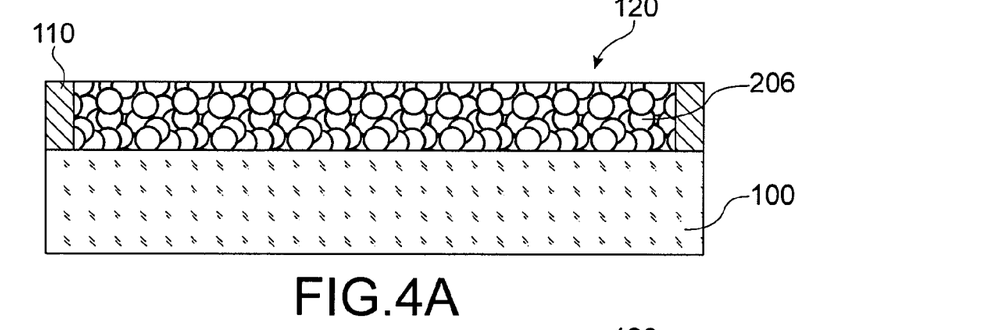
FIGS. 4A-4D illustrate an example of method for producing a porous material.

Firstly a deposition is carried out on the support 100 of a liquid comprising beads 206 in suspension (FIG. 4A).

The beads 206 may be for example polystyrene beads having a diameter that may be for example between several nanometers and ten or so micrometers. The interstitial dimensions between the beads 206 are small, in other words in the case of an optical application markedly less than the range of wavelengths of the visible domain. The maximum diameter of the beads may be chosen so as to be less than or equal to twice the height of the walls 110, and preferably less than or equal to half the height of the walls 110.

Such a distribution may be for example obtained by mixing by centrifugation for example of several populations of beads. The distribution of the diameters is preferably chosen so as to limit the presence of sealed porosity. The distribution of the diameters of beads may be optimized to obtain a totally open porosity.

The beads of polystyrene may be contained in a liquid. A sedimentation into a compact assembly may then be carried out by centrifugation, as is described for example in the document: "Inverse silica opal photonic crystals for optical sensing applications", Y. Nishijima, K. Ueno, S. Juodkazis, et al., Optics Express, 15(20), 12979, 2007, or in the document: "Opal circuits of light-planarized microphotonic crystal chips", S. M. Yang, H. Miguez, G. A. Ozin, Advanced Functional Materials, 12, 425, 2002.

The liquid comprising the beads in suspension may be a solvent, or a liquid intended to form the final constituent of the porous material after having been solidified.

In the case where the liquid containing the beads 206 is a solvent, a drying at a temperature compatible with the support 100, for example below 150° C. or 100° C., is carried out. The beads may then be compacted during drying.

Figure 4B:
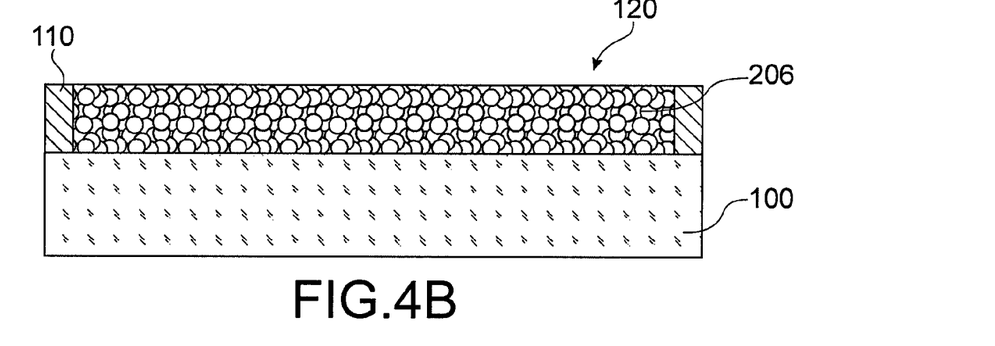

The layer of beads formed following the drying is then infiltrated by another appropriate liquid material 209.

Figure 4C:
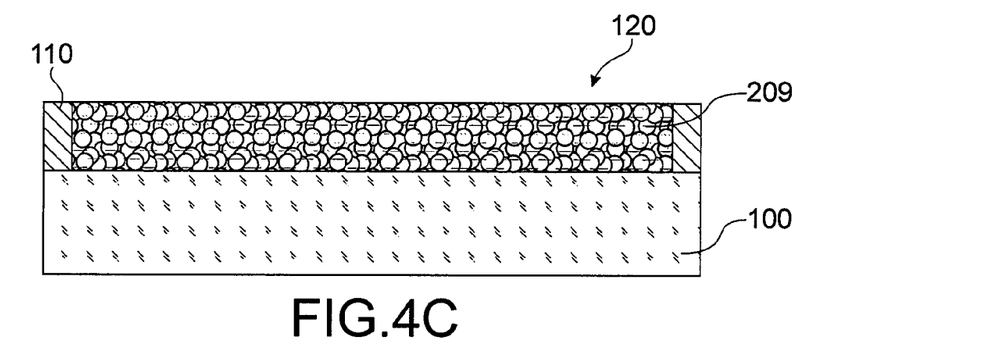
Figure 4D:
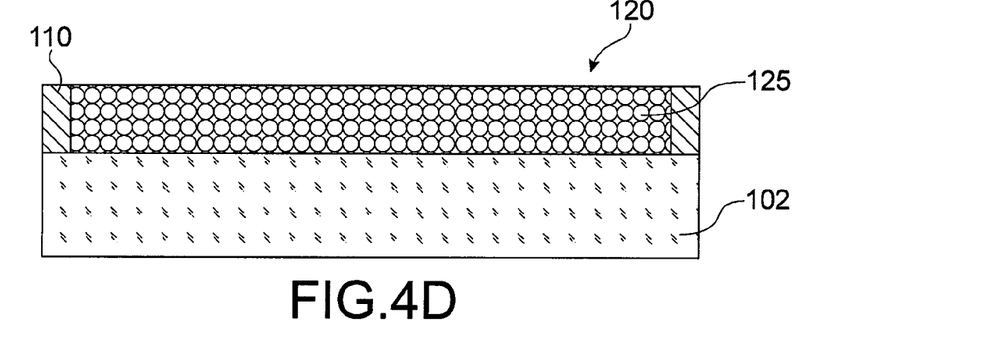

The beads are then eliminated, for example by dissolution. Following this dissolution, a porous material 125 is obtained.

A gas phase cleaning method may if necessary be carried out in order to complete this dissolution.

A silica sol-gel may be implemented, such as for example tetraethoxysilane titanium oxide such as for example titanium ethoxide. A gel thereby obtained is then dried at a suitable temperature, for example below 150° C. or 100° C.

In the case of polymer beads, the dissolution may be carried out for example by means of ethyl acetate, or tetrahydrofuran or any other appropriate means. According to another embodiment possibility of the step described previously with reference to FIG. 4B, a solution of organic monomers may if necessary be used to infiltrate the assembly of beads 206. Such a solution has the advantage of not requiring a high drying temperature. The solution of organic monomers is chosen so as to be able to be cured by thermal treatment or by UV exposure, and so that the infiltrated polymer once cured is not soluble in the dissolvent then used to eliminate the beads. The organic monomer may if necessary be a photosensitive resin.

According to an alternative, the beads of polystyrene may be replaced for example by silica beads infiltrated by a polymerizable solution. In this case, the silica beads are then eliminated by a solution of hydrofluoric acid or a gas phase hydrofluoric acid treatment.

Thus, in the embodiment example of the retention matrix that has just been given, firstly a liquid based on a solvent containing beads (FIG. 4A) is delivered into the cavities 120.

The solvent is evaporated by a drying step (FIG. 4B).

The assembly of beads, which may have been compacted during the drying by a liquid 209 (FIG. 4C), is then infiltrated.

The infiltrated liquid 209 is then solidified.

Finally the beads are eliminated, so as to obtain a porous material 125 in which the solidified liquid 209 forms the skeleton (FIG. 4D).

Figure 5A:
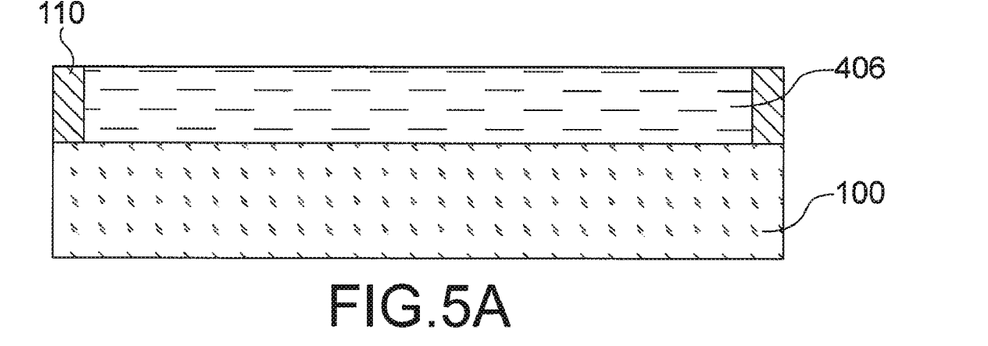
FIGS. 5A-5B illustrate another example of method for producing a porous material.
Figure 5B:
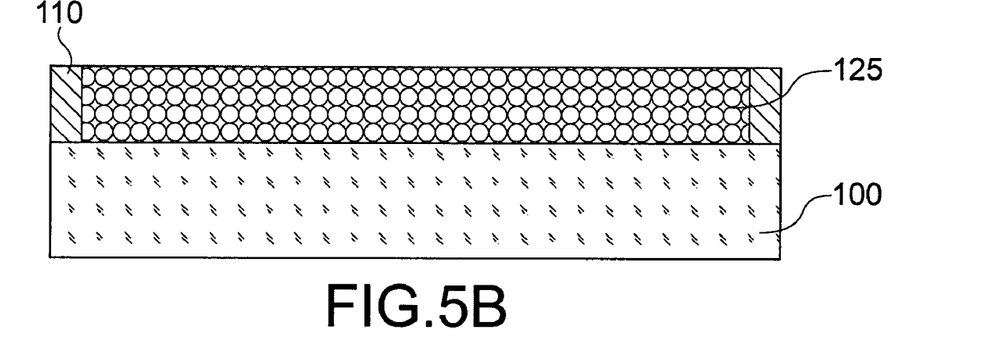

A second embodiment example of the retention matrix will now be given with reference to FIGS. 5A-5B.

In this example, the porous material 125 may be produced by means of a sol-gel extraction technique by lyophilization.

A material 406, for example of sol-gel type, is firstly deposited in the cavities 120 in the form of a liquid comprising at least one solvent. In this example, the sol-gel material 406 is deposited in the cavities 120 with or without specific control of the deposited thickness. If a control of the deposited thickness is desired, said material 406 may be delivered by an equipment implementing an ink jet technique or an equivalent precise technique. A deposition of type usually called "spray coating" or centrifugation may also be used (FIG. 5A).

The sol-gel material 406 in liquid form is then cooled so as to be solidified. For cooling and solidifying, the substrate 100 may be placed in a freezing device. Depending on the choice of the solvents present in the sol-gel material, it is possible to solidify the sol-gel material at a sufficient temperature so as not to deteriorate the substrate 100. The solvent or solvents present in the sol-gel may be sublimated by vacuum extraction by placing the device, while being produced, in an enclosure under primary vacuum. The input of a controlled thermal energy then makes it possible to carry out the sublimation of the solvents. Once all of the solvents have been extracted, a porous material 125 in the form of an aerogel (FIG. 5B) may be obtained.

Once returned to room pressure and temperature, in a case where the precursor liquid of the aerogel has been dispensed, without precise volumic control, it is possible to carry out a chemical mechanical polishing (CMP) to remove the excess material extending above the walls 110 of the cavities 120.

A third embodiment example of the retention material will now be given. In this example, the porous material 125 may be obtained by means of a technique of supercritical extraction of a sol-gel material. A supercritical drying with $CO_2$ method may for example be carried out by applying a high pressure, for example around 74 bars, at a temperature close to room temperature. In this case, the support 100 is provided to withstand such a pressure. In this example, the support 100 may be formed of at least one layer based on glass, or a polymer film such as PET adhering to another layer, for example acrylate based. To protect the device during production from a phenomenon of solvation of $CO_2$ during the supercritical extraction a joint such as a joint of polymerized epoxy adhesive may be used.

For this extraction method by supercritical $CO_2$, the suitable sol-gel material is firstly delivered by a suitable technique, for example an ink jet type technique, into the cavities 120. The starting material used to form the porous material may be based on silica, or another material capable of being transformed into an inorganic gel.

Then, the material with which the cavities 120 have been filled is transformed into gel. The device being produced may then be taken to supercritical $CO_2$ conditions in a suitable autoclave, in order to carry out an extraction.

According to another embodiment possibility, different to the three examples described previously in which the cavities are filled with porous material, once said cavities have been formed, the porous material filling the cavities 120 may be formed, from a same layer of material as the walls 110.

Figure 6A:
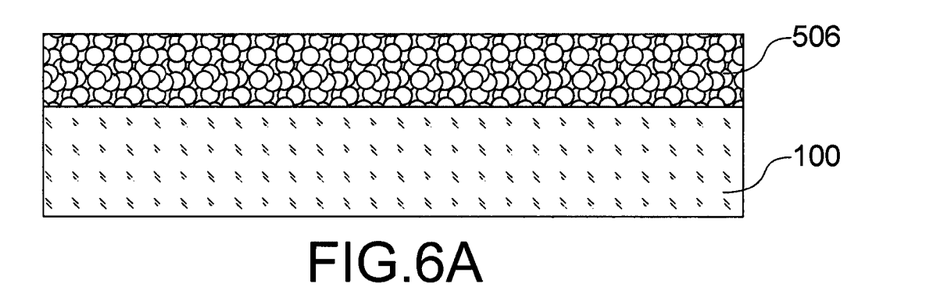
FIGS. 6A-6C illustrate another example of method for producing microcavities filled with porous material, the cavities and the material being formed from a same layer.
Figure 6B:
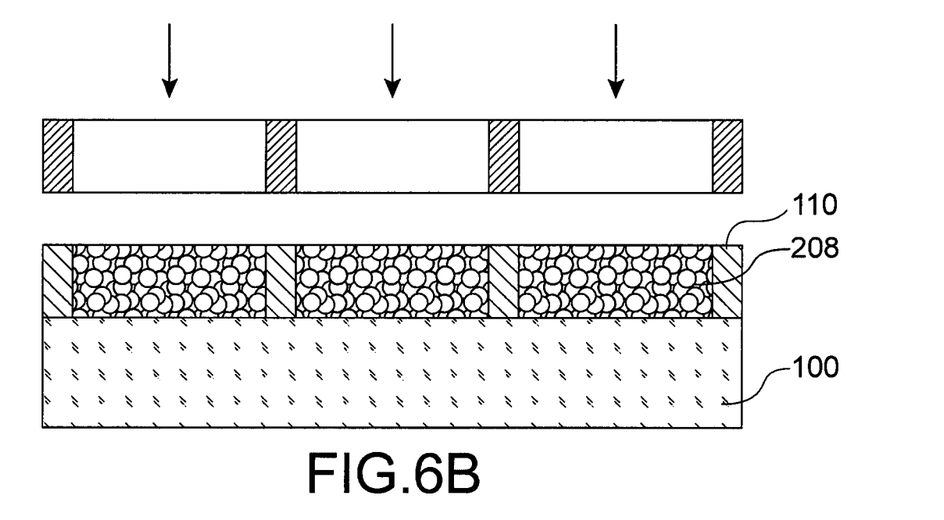
Figure 6C:
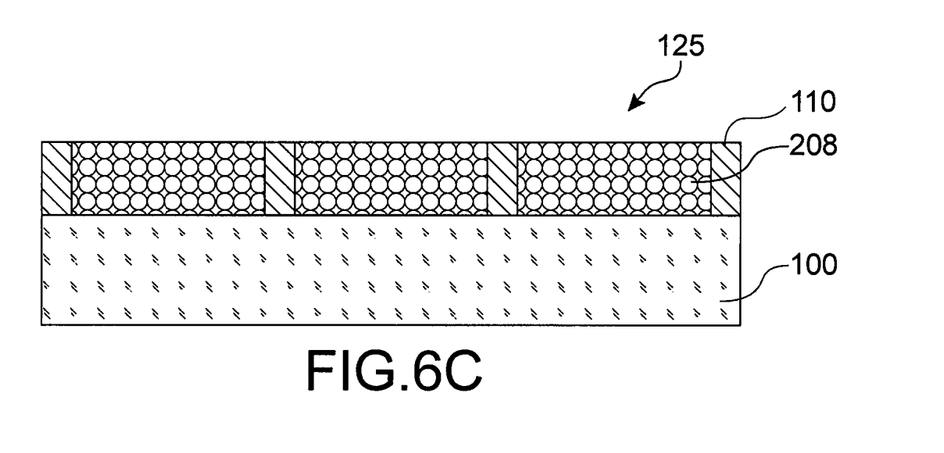

This other embodiment possibility of the porous material 125 is given in FIGS. 6A-6C.

To do this, a layer of material 506 intended to form the walls 110 (FIG. 6A) is deposited on the support 100. Said material 506 may be for example a photosensitive resin such as an ORMOCER® based resin.

The walls 110 may be formed for example by photolithography of the material 506. The exposed parts are developed, and intended to form the walls 110 (FIG. 6B).

Then, an extraction of the non-exposed parts of the material 506 is carried out, so as to form a porous material 125 for example based on aerogel (FIG. 6C).

One advantage of this embodiment is that the porous material 125 has a thickness identical to the height of the walls 110 of the cavities 120.

According to the example that has just been given, the porous material 125 is formed from a same layer of sol-gel material as the walls 110 of the microcavities.

The cavities 120 are formed by deposition of a layer of sol-gel material, then by photolithography. Then, after exposure of the sol-gel material, an annealing is carried out. The sol-gel material remaining inside the cavities undergoes a drying treatment, for example by lyophilization so as to form the porous material 125. This embodiment has the particular advantage of avoiding a CMP step of the porous material 125 once the cavities have been filled.

Examples of producing the porous material 125, also called retention matrix, in cavities, in particular microcavities, formed on a support 100 have just been given.

The cavities may be produced from a photosensitive material of negative polarity but also, according to an alternative, with a photosensitive material of positive polarity.

Figure 1C:
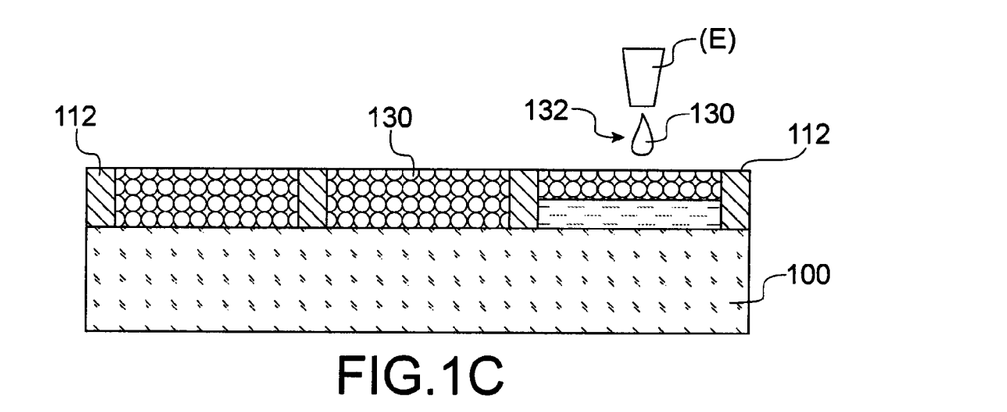

After having formed the porous material 125, a filling of the cavities 120 is carried out by means of a given liquid 130 or several given liquids (FIG. 1C).

The liquid 130 may be a liquid known as "functional", in other words chosen for specific properties. In the case of an application to an optical device, the functional liquid 130 may be chosen for specific optical properties such as its refractive index, or/and its light absorption capacity.

The given liquid 130 may be chosen so as to have a refractive index similar to that of the porous material 125. Preferably, for an optical application, the porous material 125 is formed so that the greater the difference between the refractive index of the liquid 130 infiltrating the porous material 125 and the refractive index of said porous material 125, the more limited the fraction of sealed porosities in the porous material.

According to several examples, the given functional liquid 130 may be: a mineral oil such as the Isopar® range produced by the Exxon Chemicals company, or an oil of the type of those employed in printing inks, (ink jet or offset), a silicone oil, or a thermoreversible gel based on a liquid and a gelling agent such as for example: N-benzyloxycarbonyl-L-alanine-4-hexadecanoyl-2-nitrophenyl ester with cyclohexane.

The filling may be carried out by an equipment E targeting the interior of the cavities 120 and projecting the liquid material 130 in the form of a jet or drops 132, of a volume that may be around the picoliter or one or more tens of picoliters.

The equipment E used for filling the cavities 120 may be provided to deliver a liquid 130 according to a technique similar to that of the technique by ink jet and if necessary similar to the technique used to deliver the porous material 125 into the cavities 120.

The liquid 130 may be chosen particularly so as to have a good wettability with the porous material 125, so that it spreads into all of the pores of the porous material 125. To this end, the chosen liquid may contain surfactants making it possible to lower the surface tension of the liquid and to facilitate its infiltration into the porous material 125 present in the cavities 120, in particular when the diameter of the pores is at least greater than 500 nm.

The liquid material 130 may comprise one or more organic solvents. According to one example, the solvent used may be a solvent having a low saturating vapor pressure such as SANTOVAC® 5 polyphenyl ether or a silicone oil such as for example a solvent such as dimethicone or trimethicone or a derivative of one or the other of these organic solvents.

In one case where for example, to favor a highly porous material 125 based on silica sol-gel being obtained, a hydrophobic material, such as for example hexamethyldisilazane, has been used in order to reduce certain harmful effects of a supercritical drying or to dispense with a step of supercritical drying, it is then possible to modify the surface condition of the porous material 125 by a UV/ozone type photo-calcination treatment to control the surface energy and the chemical affinity of this material 125 with a filling liquid.

The porosity of the material 125 is provided sufficiently high to enable the functional liquid 130 to infiltrate at the moment of its deposition.

In the case of an optical application of the device, by forming microcavities filled with porous material 125 containing the liquid 130, the formation of menisci causing undesirable optical effects is limited or eliminated. The liquid 130 impregnates into the porous material 125 and is retained by capillary effect. Said liquid 130 is thereby trapped in the porous material 125.

Then, (FIG. 1D) a layer 150 for sealing the cavities is deposited. The sealing layer may be formed on the summit 112 of the walls 110 and on the surface of the porous material 125 impregnated with the liquid 130 or at the level of the upper part of the porous material 125.

Figure 1D:
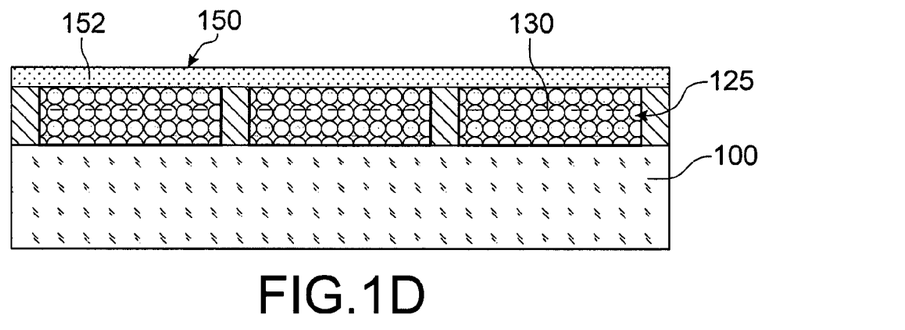

The sealing layer 150 is provided in particular to form a barrier to moisture, to acids, and to solvents, and if necessary an electrically insulating layer. The material 152 of the sealing layer 150 may be a suitable adhesive, if necessary transparent for an optical application. The sealing layer 150 may be for example an optical adhesive for example of EPOTEK 302-3M® or MASTERBOND® UV11-3 type.

The sealing layer 150 may also be based on a material such as polyV3D3 (abbreviation for poly(1,3,5-trivinyltrimethyl-cyclotri-siloxane) with a view to sealing by means of a continuous, conformable film, of low thickness, colorless and transparent to visible radiation, as well as good protection properties.

When the material 152 of the sealing layer 150 is polyV3D3 or parylene, its deposition may be carried out under a pressure between 1 and 500 mbars, or under primary vacuum. At such a pressure, the filling liquids normally have a tendency to evaporate. In the present case, the liquid 130 filling the pores of the porous material 125 is retained by capillarity, such that evaporation phenomena do not appear.

According to another example, the material used to form the sealing layer 150, may be a two component material such as a two component epoxy adhesive, for example of MASTERBOND® EP30 type. A first of the compounds of the two component material may be delivered for example by a technique of centrifugation, or spreading of type normally called "meniscus coating" or "blade coating", or by ink jet or by "spray".

The second compound may, for its part, be delivered for example by a contact-free technique of "spray", or ink jet type.

Figure 2A:
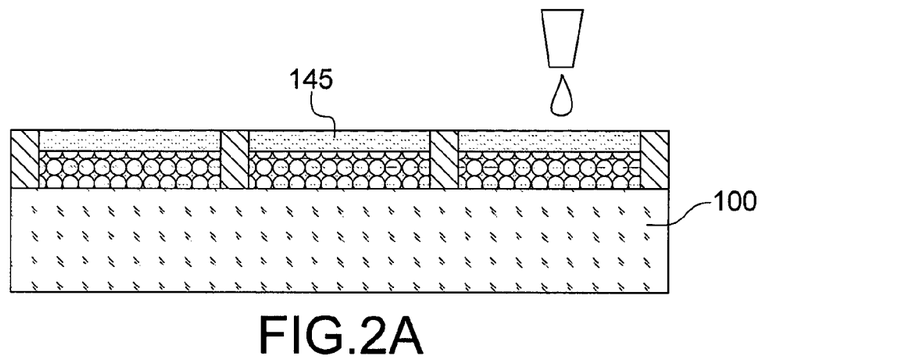
FIGS. 2A-2B illustrate another example of method according to the invention.

As indicated previously, the sealing layer may be formed in a part of the thickness of the porous material, for example in a case where one only part of the thickness of porous material 125 is impregnated with the liquid 130. This formation of the sealing layer 150 may be carried out by delivering another liquid 145 intended to form a solid polymer layer, onto the porous material 125 already filled with functional liquid (FIG. 2A). The other liquid 145 is polymerizable and preferably not miscible with the functional liquid 130 filling the cavities 120. The other liquid 145 may be for example an adhesive polymerizable under UV intended to be delivered by means of a "spin coating", "dipping", "spray coating" or "meniscus coating" type method, for example a Vitralit 6127® type adhesive of the Eleco company. The other liquid 145 infiltrates into the porous material 125 until reaching the functional liquid 130 already present. To avoid an entrapment of air, a vacuum deposition may be carried out.

The confinement of the porosities of the porous material 125 may make it possible to prevent a mixing between the functional liquid 130 and the other liquid 145.

Figure 2B:
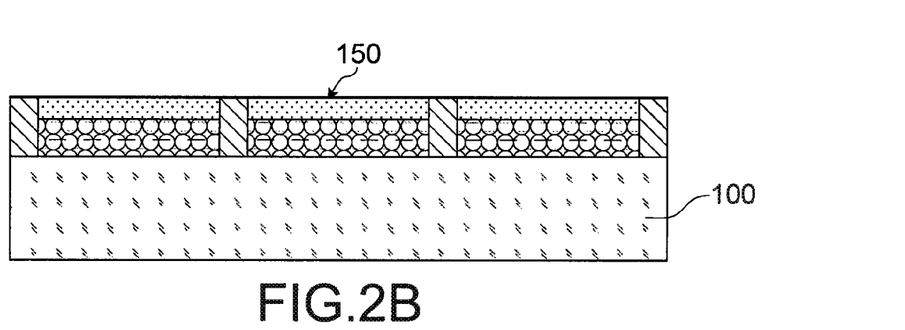

At the end of this deposition, a sealing layer 150 based on polymer material trapped in the porous material is produced.

An embodiment example with a single functional liquid trapped in the porous material 125 has just been given.

According to another implementation possibility, one or more cavities 120 may be filled with a mixture of several liquids, for example printing inks deposited by ink jet, or liquid solutions containing functional molecules or for example molecules changing state under magnetic or optical field.

Figure 3:
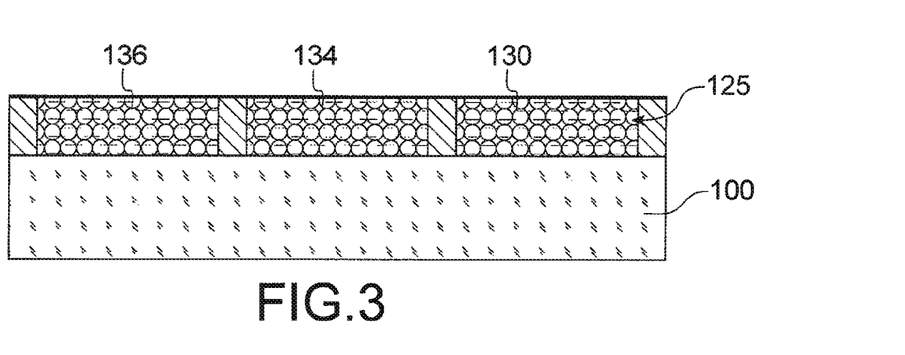
FIG. 3 illustrates another example of method according to the invention.

According to yet another implementation possibility, several cavities 120 may also be filled with liquids 130, 134, 136 different from one cavity to the other, for example ink jet printing inks to ensure a totally transparent printing support type function. This may be implemented particularly for an optical application of the device, when it is aimed to confer to the cavities optical properties different to each other, such as for example for an optical filter wherein each cavity is provided to filter a specific range of wavelengths (FIG. 3).

According to another example, a functional liquid in the form of an electrolyte may be delivered into the cavities and infiltrated into the porous material 125. This may be carried out for example to produce electronic components.

One or the other of the methods described previously may be used in numerous applications such as for example for the production of electronic components and particularly supercapacitors or components suited to the transfer of charges in organic photovoltaic cells.

For these applications, electrodes on the upper face of the substrate and on the lower face of the sealing layer may moreover be formed. These electrodes may be formed in full layer or instead be arranged in matrix in the manner of a flat screen or in series in the manner of a photovoltaic cell.

The invention claimed is:

1. Method for producing a device provided with one or more sealed cavities filled with at least one liquid trapped in a porous retention material, comprising the steps of:
   a) forming a porous material in one or more cavities produced in at least one given layer deposited on a support, one or more walls formed in said layer separating between them the cavities,
   b) filling at least one of said cavities by means of at least one liquid, the liquid being trapped in the porous material,
   c) forming a sealing layer enabling said cavities to be individually sealed and to form separate sealed enclosures,
   wherein the porous material and the walls of the cavities are each formed from said given layer; and
   wherein step a) comprises the steps of:
      depositing a layer of at least one given material, the given material being suited to being transformed into gel and being photosensitive,
      exposing to a light radiation first parts of the layer of said given material, whereas second parts of the layer of said given material are protected from said radiation, the first parts or the second parts being intended to form said walls of said cavities, and
      forming porosities in certain parts of the layer of said given material.

2. Method according to claim 1, wherein, after production of said cavities, the formation of said porous material at step a) comprises steps of:
   depositing in at least one of said cavities a liquid comprising particles in suspension,
   eliminating said liquid, so as to form a cluster of particles, in particular a cluster of beads.

3. Method according to claim 2, wherein, after production of said cavities, the formation of said porous material at step a) further comprises, steps:
   of infiltration of the cluster of beads by a liquid intended to be solidified,
   of solidification of said liquid,
   of eliminating said particles.

4. Method according to claim 1, wherein after formation of said cavities, the formation of the porous material at step a) comprises steps of:
   depositing in at least one of said cavities a mixture of at least one given material, liquid capable of being transformed into gel and of at least one solvent,
   treating said mixture so as to transform said given material into gel,
   eliminating said solvent.

5. Method according to claim 1, said sealing layer being formed of a material infiltrated into porosities of said porous material or covering said porous material.

6. Method according to claim 1, the sealing layer being formed by polymerization of a polymerizable liquid spread out on said porous material.

7. Method according to claim 1, the sealing layer being formed at a pressure between 1 and 500 mbars, or under primary vacuum.

8. Method according to claim 1, wherein the sealing layer is based on poly-para-xylylene, poly(1,3,5-trivinyl trimethyl cyclotrisiloxane), or at least one adhesive transparent in the visible radiation domain, or at least one ink polymerizable under ultraviolet.

9. Method according to claim 1, the porous material being an aerogel or being formed by means of a porogen material.

* * * * *